United States Patent
Balakrishnan et al.

(10) Patent No.: US 9,443,982 B1
(45) Date of Patent: Sep. 13, 2016

(54) VERTICAL TRANSISTOR WITH AIR GAP SPACERS

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/018,066

(22) Filed: Feb. 8, 2016

(51) Int. Cl.
*H01L 29/66* (2006.01)
*H01L 29/786* (2006.01)
*H01L 29/423* (2006.01)

(52) U.S. Cl.
CPC ... *H01L 29/78642* (2013.01); *H01L 29/42392* (2013.01); *H01L 29/66545* (2013.01); *H01L 29/66742* (2013.01); *H01L 29/78696* (2013.01); *H01L 2029/42388* (2013.01)

(58) Field of Classification Search
CPC ............. H01L 29/0649; H01L 29/165; H01L 29/41741; H01L 29/78642; H01L 29/78696; H01L 29/42392; H01L 29/66545; H01L 29/66742; H01L 2029/42388
See application file for complete search history.

(56) References Cited

U.S. PATENT DOCUMENTS

| | | | |
|---|---|---|---|
| 5,736,446 A | 4/1998 | Wu | |
| 5,770,507 A | 6/1998 | Chen et al. | |
| 5,914,519 A | 6/1999 | Chou et al. | |
| 6,001,695 A | 12/1999 | Wu | |
| 6,104,077 A | 8/2000 | Gardner et al. | |
| 6,238,987 B1 | 5/2001 | Lee | |
| 6,891,235 B1* | 5/2005 | Furukawa | H01L 21/26586 257/408 |
| 7,691,712 B2 | 4/2010 | Chidambarrao et al. | |
| 8,216,909 B2 | 7/2012 | Abadeer et al. | |
| 8,349,697 B2 | 1/2013 | Abadeer et al. | |
| 8,637,384 B2 | 1/2014 | Ando et al. | |
| 8,637,930 B2 | 1/2014 | Ando et al. | |
| 9,035,365 B2* | 5/2015 | Adam | H01L 29/6656 257/288 |
| 2009/0315074 A1* | 12/2009 | Wang | H01L 29/0649 257/190 |
| 2011/0309416 A1* | 12/2011 | Yamashita | H01L 21/764 257/288 |
| 2012/0018806 A1* | 1/2012 | Furukawa | H01L 21/84 257/347 |
| 2013/0146846 A1* | 6/2013 | Adkisson | H01L 29/66045 257/27 |
| 2016/0104798 A1* | 4/2016 | Kim | H01L 29/7827 257/329 |

FOREIGN PATENT DOCUMENTS

| | | | |
|---|---|---|---|
| KR | 1020010045126 A | | 6/2001 |
| TW | 432544 B | | 5/2001 |

* cited by examiner

*Primary Examiner* — Yosef Gebreyesus
(74) *Attorney, Agent, or Firm* — Scully, Scott, Murphy & Presser, P.C.; Louis J. Percello, Esq.

(57) ABSTRACT

A semiconductor structure containing a vertical transistor having air gap spacers located above and below each functional gate structure is provided. Notably, a bottom air gap spacer is located between a bottommost surface of first and second functional gate structures and a topmost surface of a bottom source/drain region, and a top air gap spacer is located between a topmost surface of the first and second functional gate structures and a surface of the top source/drain region.

20 Claims, 15 Drawing Sheets

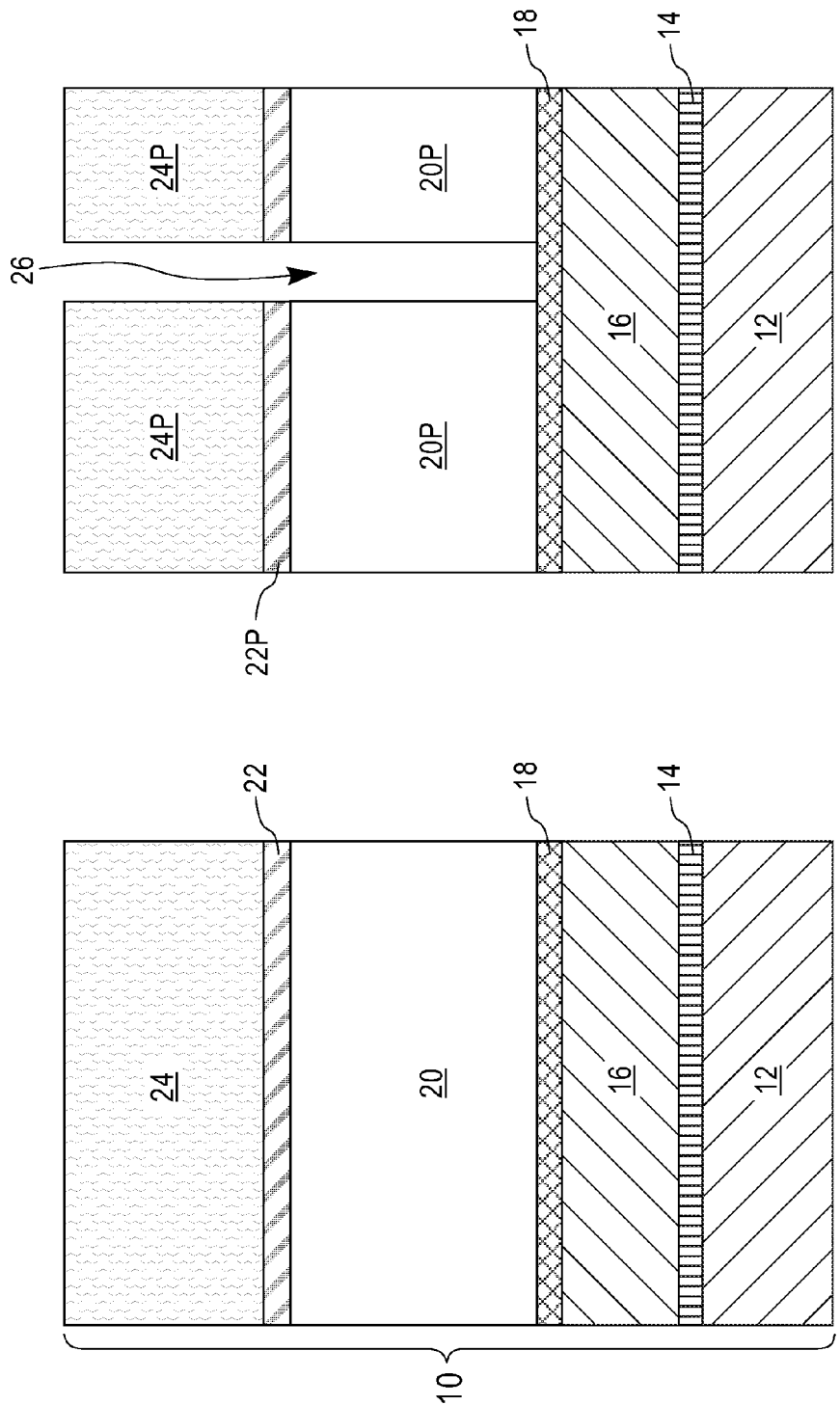

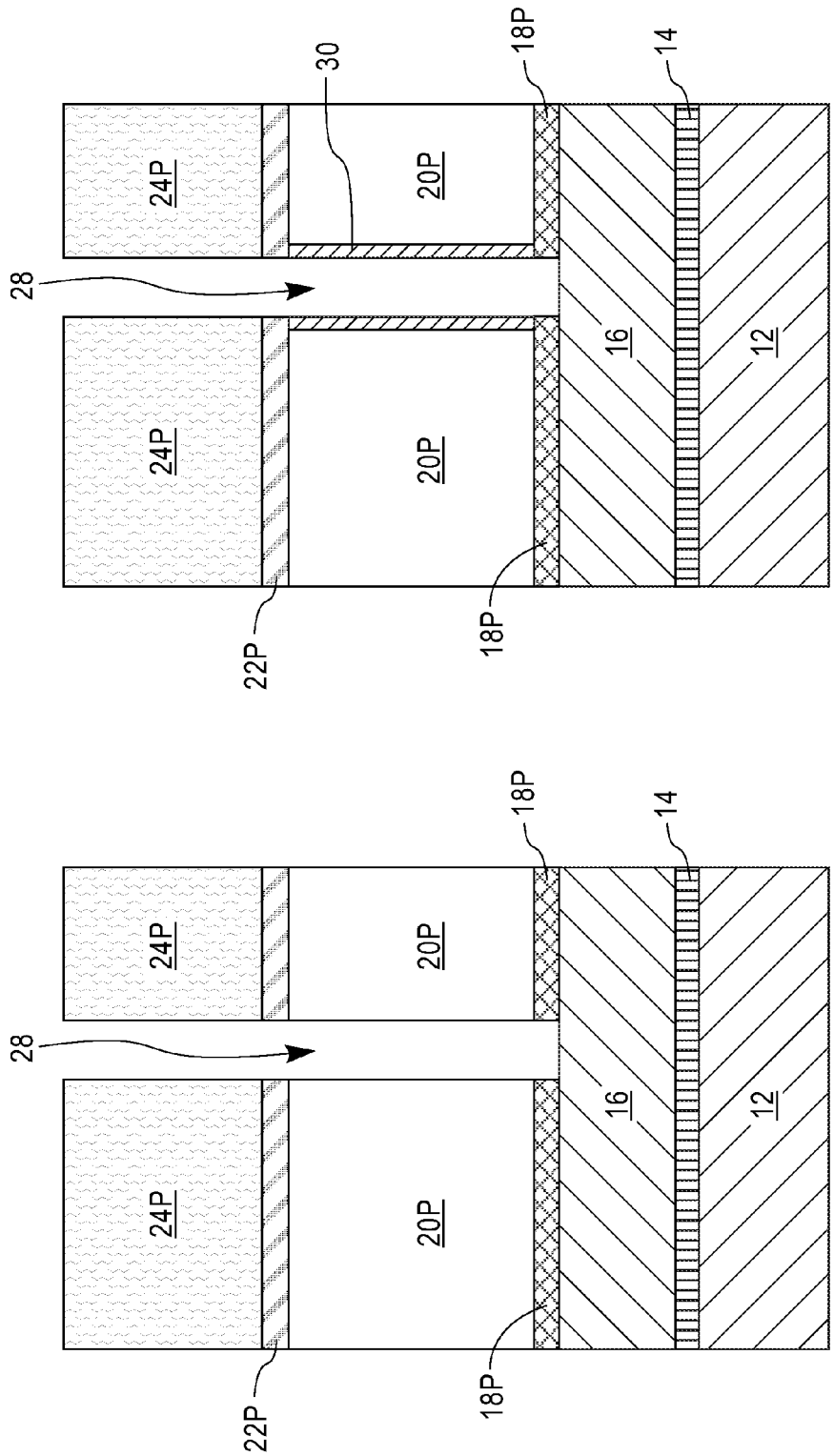

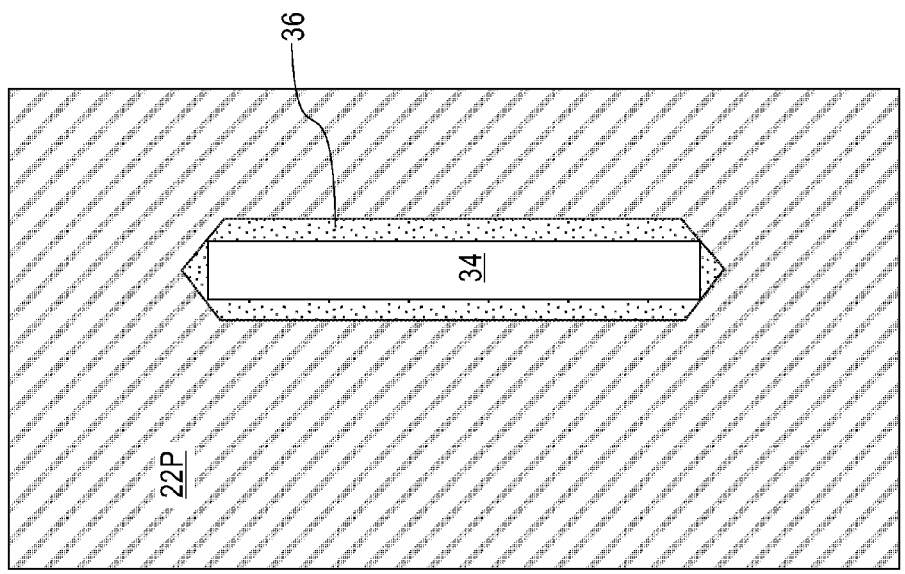
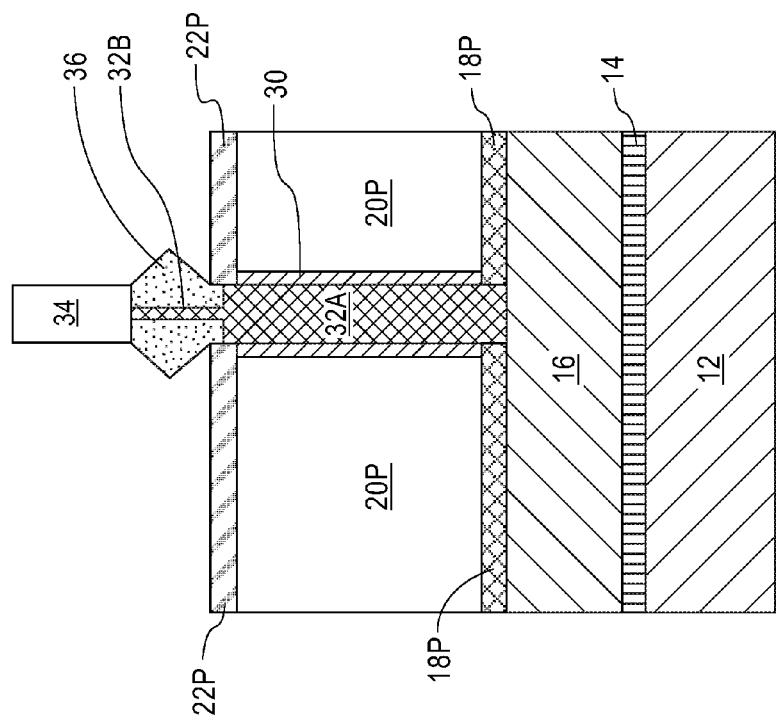
FIG. 7B
FIG. 7A

VERTICAL TRANSISTOR WITH AIR GAP SPACERS

BACKGROUND

The present application relates to a semiconductor structure and a method of forming the same. More particularly, the present application relates to a semiconductor structure containing a vertical transistor having air gap spacers located above and below each functional gate structure, and a method of forming the same.

Conventional vertical transistors are devices where the source-drain current flows in a direction normal to the substrate surface. In such devices, a vertical semiconductor pillar defines the channel with the source and drain located at opposing ends of the semiconductor pillar. One advantage of a vertical transistor is that the channel length is not defined by lithography, but by methods such as epitaxy or layer deposition, which enable precise dimensional control.

As such, vertical transistors are an attractive option for technology scaling for 5 nm and beyond. The increasing density in those technology nodes has the effect of increasing the parasitic capacitance between the gate and the source/drain epitaxy. There is thus a need for providing vertical transistors for use in future technology nodes in which the parasitic capacitance has been reduced.

SUMMARY

A semiconductor structure containing a vertical transistor having air gap spacers located above and below each functional gate structure is provided. Notably, a bottom air gap spacer is located between a bottommost surface of first and second functional gate structures, and a topmost surface of a bottom source/drain region, and a top air gap spacer is located between a topmost surface of the first and second functional gate structures and a surface of the top source/drain region.

In one aspect of the present application, a semiconductor structure is provided. In one embodiment of the present application, the semiconductor structure includes an epitaxial semiconductor channel material structure extending from a topmost surface of a bottom source/drain region. The epitaxial semiconductor channel material structure has a bottom portion of a first thickness and an upper portion of a second thickness that is less than the first thickness. The semiconductor structure further includes a first functional gate structure located on one side of the epitaxial semiconductor channel material structure, and a second functional gate structure located on another side of the epitaxial semiconductor channel material structure. A top source/drain region extends from a sidewall of the top portion of the epitaxial semiconductor channel material structure and contacts exposed portions of a topmost surface of the lower portion of the epitaxial semiconductor channel material structure. The exemplary semiconductor structure further includes a bottom air gap spacer located between a bottommost surface of the first and second functional gate structures and the topmost surface of the bottom source/drain region, and a top air gap spacer located between a topmost surface of the first and second functional gate structures and a surface of the top source/drain region.

In another aspect of the present application, a method of forming a semiconductor structure is provided. In one embodiment of the present application, the method includes forming an epitaxial semiconductor channel material structure extending from a topmost surface of a bottom source/drain region, the epitaxial semiconductor channel material structure has a bottom portion of a first thickness and an upper portion of a second thickness that is less than the first thickness. Next, a top source/drain region is formed extending from a sidewall of the top portion of the epitaxial semiconductor channel material structure and contacting exposed portions of a topmost surface of the lower portion of the epitaxial semiconductor channel material structure. A first functional gate structure is formed on one side of the epitaxial semiconductor channel material structure, and a second functional gate structure is formed on another side of the epitaxial semiconductor channel material structure. Next, a bottom air gap spacer is formed between a bottommost surface of the first and second functional gate structures and the topmost surface of the bottom source/drain region, and a top air gap spacer is formed between a topmost surface of the first and second functional gate structures and a surface of the top source/drain region.

BRIEF DESCRIPTION OF SEVERAL VIEWS OF THE DRAWINGS

FIG. 1 is a cross sectional view of an exemplary semiconductor structure of a material stack of, from bottom to top, a base semiconductor substrate, a first semiconductor material having a first conductivity type, a second semiconductor material having a second conductivity type that is opposite the first conductivity type, a bottom sacrificial spacer material, a sacrificial gate material, a top sacrificial spacer material, and a first hard mask material.

FIG. 2 is a cross sectional view of the exemplary semiconductor structure of FIG. 1 after forming an opening in the material stack that exposes a portion of a topmost surface of the bottom sacrificial spacer material.

FIG. 3 is a cross sectional view of the exemplary semiconductor structure of FIG. 2 after extending the opening in the material stack into the bottom sacrificial spacer material to expose a portion of a topmost surface of the second semiconductor material.

FIG. 4 is a cross sectional view of the exemplary semiconductor structure of FIG. 3 after forming an oxide liner into exposed sidewalls of each remaining portion of the sacrificial gate material in the extended opening.

FIG. 7A is a cross sectional view of the exemplary semiconductor structure of FIG. 6 after removing the remaining portions of the first hard mask material, laterally recessing exposed portions of the remaining portion of the epitaxial semiconductor channel material, and epitaxially growing a top source/drain region.

FIG. 7B is a top down view of the exemplary semiconductor structure shown in FIG. 7A.

DETAILED DESCRIPTION

Figures 5, 6:
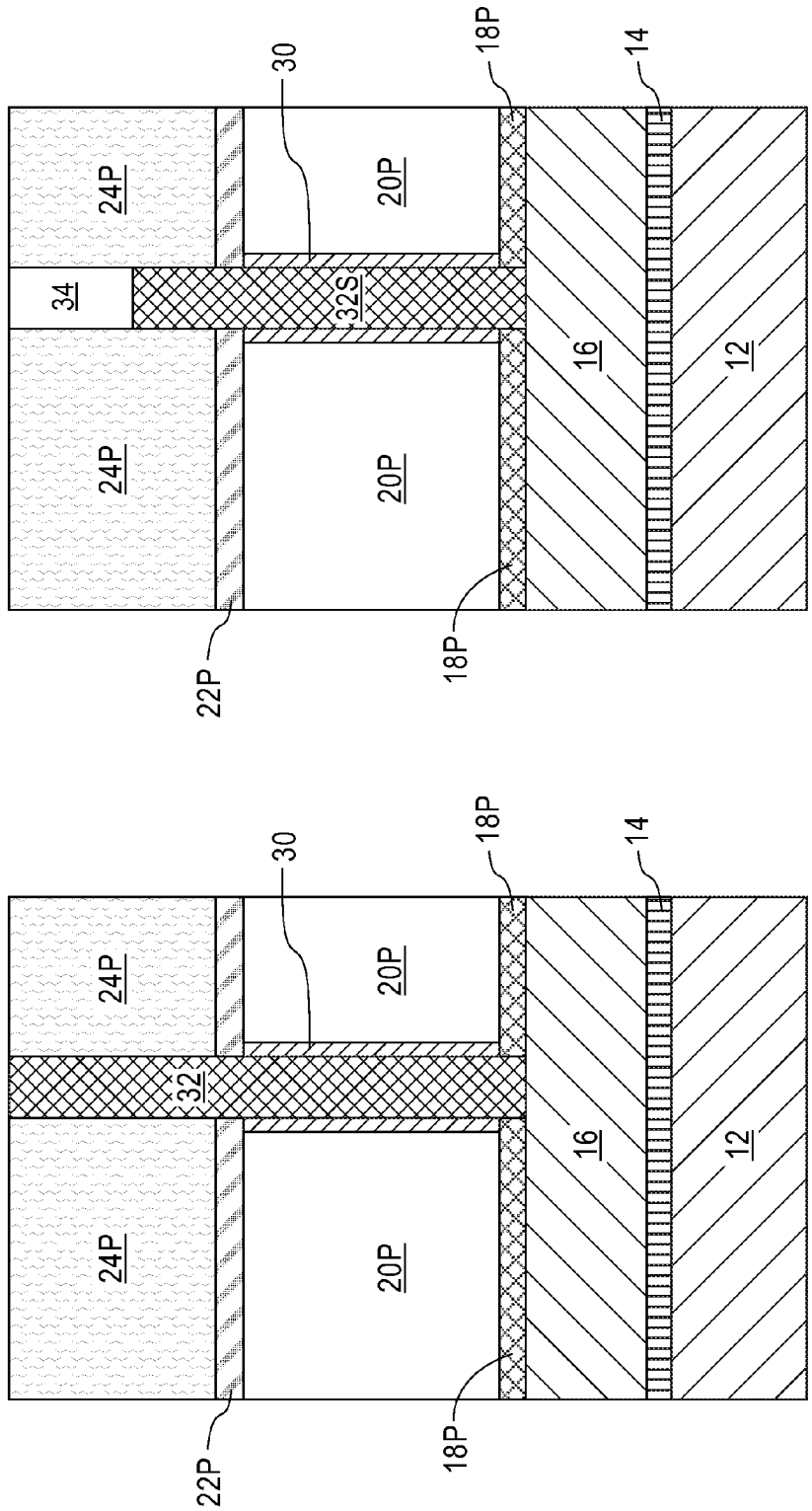
FIG. 5 is a cross sectional view of the exemplary semiconductor structure of FIG. 4 after forming an epitaxial semiconductor channel material from the exposed topmost surface of the second semiconductor material.
FIG. 6 is a cross sectional view of the exemplary semiconductor structure of FIG. 5 after recessing the epitaxial semiconductor channel material, and forming a second hard mask material, which has a different etch selectivity than the first hard mask material, on the remaining portion of the epitaxial semiconductor channel material.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure in accordance with an embodiment of the present application. Notably, and as shown in FIG. 1, the exemplary semiconductor structure includes a material stack 10 of, from bottom to top, a base semiconductor substrate 12, a first semiconductor material 14 having a first conductivity type, a second semiconductor material 16 having a second conductivity type that is opposite the first conductivity type, a bottom sacrificial spacer material 18, a sacrificial gate material 20, a top sacrificial spacer material 22, and a first hard mask material 24.

The base semiconductor substrate 12 of material stack 10 may include at least one semiconductor material having semiconducting properties. Examples of semiconductor materials that may provide at least a portion of the base semiconductor substrate 12 may include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In one embodiment, the base semiconductor substrate 12 is a bulk semiconductor substrate. By "bulk" it is meant that the semiconductor substrate is entirely composed of at least one semiconductor material, as defined above. In one example, the base semiconductor substrate 12 may be entirely composed of silicon. In some embodiments, the bulk semiconductor substrate may include a multilayered semiconductor material stack including at least two different semiconductor materials, as defined above. In one example, the multilayered semiconductor material stack may comprise, in any order, a stack of Si and a silicon germanium alloy.

In another embodiment of the present application, the base semiconductor substrate 12 of material stack 10 comprises a topmost semiconductor material layer of a semiconductor-on-insulator (SO) substrate. The SOI substrate would also include a handle substrate (not shown) including one of the above mentioned semiconductor materials, and an insulator layer (not shown) such as a buried oxide below the topmost semiconductor material layer.

In any of the above embodiments mentioned above, the semiconductor material that provides the base semiconductor substrate 12 may be a single crystalline semiconductor material. The semiconductor material that provides the base semiconductor substrate 12 may have any of the well known crystal orientations. For example, the crystal orientation of the base semiconductor substrate 12 may be {100}, {110}, or {111}. Other crystallographic orientations besides those specifically mentioned can also be used in the present application.

The first semiconductor material 14 having the first conductivity type may include one of the semiconductor materials mentioned above for providing the base semiconductor substrate 12. In one embodiment, the first semiconductor material 14 may comprise a same semiconductor material as the base semiconductor substrate 12. For example, the base semiconductor substrate 12 and the first semiconductor material 14 may be composed of silicon. In yet another embodiment, the first semiconductor material 14 may comprise a different semiconductor material than the semiconductor base substrate 12. For example, the base semiconductor substrate 12 may comprise silicon, while the first semiconductor material 14 may comprise a silicon germanium alloy or a layer of germanium.

The first conductivity type of the first semiconductor material 14 may be provided by a p-type or n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

In one embodiment of the present application, the concentration of n-type or p-type dopant within the first semiconductor material 14 can range from $1 \times 10^{18}$ atoms/cm$^3$ to $1 \times 10^{21}$ atoms/cm$^3$, although dopant concentrations greater than $1 \times 10^{21}$ atoms/cm$^3$ or less than $1 \times 10^{18}$ atoms/cm$^3$ are also conceived. In one embodiment, the doping within the first semiconductor material 14 may be uniform (i.e., have a uniform distribution of dopants throughout the entire region). In another embodiment, the doping within the first semiconductor material 14 may be graded. The first semiconductor material 14 is oppositely doped to the second semiconductor material 16 of material stack 10 so as to act as a punch through stop layer.

In one embodiment of the present application, the first semiconductor material 14 may have a thickness from 20 nm to 100 nm. Other thicknesses that are lesser than, or greater than, the aforementioned thickness range may also be employed in the present application as the thickness of the first semiconductor material 14.

The second semiconductor material 16 having the second conductivity type may include one of the semiconductor materials mentioned above for providing the base semiconductor substrate 12. In one embodiment, the second semiconductor material 16 may comprise a same semiconductor material as the first semiconductor material 14 and the base semiconductor substrate 12. For example, the base semiconductor substrate 12, the first semiconductor material 14 and the second semiconductor material 16 may all be composed of silicon. In yet another embodiment, the second semiconductor material 16 may comprise a different semiconductor material than at least one of the semiconductor base substrate 12 or the first semiconductor material 14. For example, the base semiconductor substrate 12 may comprise silicon, the first semiconductor material 14 may comprise silicon, and the second semiconductor material 16 may comprise a silicon germanium alloy or a layer of germanium.

The second conductivity type of the second semiconductor material 16 may be provided by a p-type or n-type dopant, as defined above, with the proviso that the second conductivity type is opposite to the first conductivity type. In one example, and when the first conductivity type is n-type, then the second conductivity type is p-type. In another example, and when the first conductivity type is p-type, then the second conductivity type is n-type.

The concentration of n-type or p-type dopant within the second semiconductor material 16 is typically greater than the concentration of dopant present in the first semiconductor material 14. In one example, the concentration of dopant within the second semiconductor material 16 can range from $5 \times 10^{18}$ atoms/cm$^3$ to $5 \times 10^{21}$ atoms/cm$^3$. In accordance with the present application, the second semiconductor material 16 having the second conductivity type will serve as a bottom source/drain region (or structure) of the exemplary semiconductor structure of the present application.

In one embodiment of the present application, the second semiconductor material 16 may have a thickness from 20 nm to 50 nm. Other thicknesses that are lesser than, or greater than, the aforementioned thickness range may also be employed in the present application as the thickness of the second semiconductor material 16.

In one embodiment of the present application, the base semiconductor substrate 12, the first semiconductor material 14, and the second semiconductor material 16 of material stack 10 are formed by first providing the base semiconductor substrate 12. An epitaxial growth (or deposition) process may then be employed to form the first semiconductor material 14 and the second semiconductor material 16.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Since an epitaxial growth process is used in providing the first and second semiconductor materials (14, 16), the first and second semiconductor materials (14, 16) have an epitaxial relationship with each other as well as topmost surface of the base semiconductor substrate 12.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the first and second semiconductor materials (14, 16) can be performed utilizing any well known precursor gas or gas mixture. Carrier gases like hydrogen, nitrogen, helium and argon can be used. In some embodiments, a dopant that provides the specific conductivity type to the first and second semiconductor materials (14, 16) may be introduced in-situ into the precursor gas or gas mixture that provides the first semiconductor material 14 and/or the second semiconductor material 16. In another embodiment, a dopant that provides the specific conductivity type may be introduced into an intrinsic first semiconductor material and/or an intrinsic second semiconductor material by ion implantation or gas phase doping.

In another embodiment of the present application, the base semiconductor substrate 12, the first semiconductor material 14, and the second semiconductor material 16 of material stack 10 are formed by first providing the base semiconductor substrate 12. Dopants that provide the specific conductivity type of the first and/or second semiconductor materials may then be introduced into base semiconductor substrate 12 by ion implantation or gas phase doping.

In another embodiment of the present application, the base semiconductor substrate 12, the first semiconductor material 14, and the second semiconductor material 16 of material stack 10 can be formed utilizing a wafer bonding process.

After providing the base semiconductor substrate 12, the first semiconductor material 14, and the second semiconductor material 16 of material stack 10, the bottom sacrificial spacer material 18 is formed on a topmost surface of the second semiconductor material 16. The bottom sacrificial spacer material 18 may comprise a dielectric material including, for example, silicon dioxide, silicon nitride and/or silicon oxynitride. The bottom sacrificial spacer material 18 can be formed by a deposition process such as, for example, chemical vapor deposition (CVD) or plasma enhanced chemical vapor deposition (PECVD). In other embodiments, the bottom sacrificial spacer material 18 can be formed by a thermal process such as, for example, thermal oxidation and/or thermal nitridation. In yet other embodiments, the bottom sacrificial spacer material 18 can be formed by a combination of a deposition process and a thermal process. The thickness of the bottom sacrificial spacer material 18 can range from 10 nm to 50 nm. Other thicknesses that are lesser than, or greater than, the aforementioned thickness range may also be employed as the thickness of the bottom sacrificial spacer material 18.

Next, the sacrificial gate material 20 is formed on a topmost surface of the bottom sacrificial spacer material 18. In the present application, the sacrificial gate material 20 includes polysilicon or amorphous silicon. The sacrificial gate material 20 can be formed utilizing a deposition process including, for example, chemical vapor deposition (CVD), plasma enhanced chemical vapor deposition (PECVD), physical vapor deposition (PVD), sputtering, or atomic layer deposition (ALD). The thickness of the sacrificial gate material 20 can range from 50 nm to 200 nm. Other thicknesses that are lesser than, or greater than, the aforementioned thickness range may also be employed as the thickness of the sacrificial gate material 20.

The top sacrificial spacer material 22 is then formed on a topmost surface of the sacrificial gate material 20. The top sacrificial spacer material 22 may include one of the dielectric materials mentioned above for the bottom sacrificial spacer material 18. In one embodiment of the present application, the top sacrificial spacer material 22 and bottom sacrificial spacer material 18 include a same dielectric material. For example, the top sacrificial spacer material 22 and bottom sacrificial spacer material 18 may both comprise silicon nitride. In another embodiment of the present application, the top sacrificial spacer material 22 and the bottom sacrificial spacer material 18 comprise different dielectric materials. For example, the top sacrificial spacer material 22 may comprise silicon nitride, while the bottom sacrificial spacer material 18 may comprise silicon oxynitride. The top sacrificial spacer material 22 may be formed utilizing one of the deposition processes mentioned above for forming the bottom sacrificial spacer material 18. The top sacrificial spacer material 22 may have a thickness that is within the thickness range mentioned above for the bottom sacrificial spacer material 18.

Next, the first hard mask material 24 is formed on the topmost surface of the top sacrificial spacer material 22. The first hard mask material 24 is a contiguous hard mask material that covers the entirety of the top sacrificial spacer material 22. The first hard mask material 24 that is employed in the present application may include an oxide, a nitride and/or an oxynitride, with the proviso that the first hard mask material 24 has a different etch rate than the underlying top sacrificial spacer material 22. In one example, the first hard mask material 24 can be comprised of silicon dioxide, while the top sacrificial spacer material 22 can be comprised of silicon nitride. The first hard mask material 24 can be formed utilizing a deposition process such as described above in forming the bottom sacrificial spacer material 18. The thickness of the first hard mask material 24 can range from 20 nm to 150 nm. Other thicknesses that are lesser than, or greater than, the aforementioned thickness range may also be employed as the thickness of the first hard mask material 24.

Referring now to FIG. 2, there is illustrated the exemplary semiconductor structure of FIG. 1 after forming an opening 26 in the material stack 10 that exposes a portion of the topmost surface of the bottom sacrificial spacer material 18. Although a single opening 26 is described and illustrated, a plurality of openings can be formed in the material stack 10 that expose different portions of the topmost surface of the bottom sacrificial spacer material 18.

The opening 26 may be formed by utilizing any well known patterning process. In one embodiment of the present application, the patterning process used to define the opening 26 may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. After etching, the patterned photoresist can be removed utilizing any photoresist stripping process such as, for example, ashing.

In another embodiment, the patterning process used to define the opening 26 may include a sidewall image transfer (SIT) process. In yet another embodiment, the patterning process used to define the opening 26 may include a direct self-assembly (DSA) patterning process.

The opening 26 that is formed can have a width from 4 nm to 12 nm. The width of the opening 26 will determine the width of the channel material to be subsequently formed therein. Other widths that are lesser than or greater than the aforementioned width range may also be employed in the present application.

After forming the opening 26, portions of the sacrificial gate material 20, the top sacrificial spacer material 22, and the first hard mask material 24 remain. The remaining portions of the sacrificial gate material 20 may be referred to herein as sacrificial gate material portions 20P, the remaining portions of the top sacrificial spacer material 22 may be referred to herein as top sacrificial spacer material portions 22P and the remaining portions of the first hard mask 24 may be referred to herein as first hard mask portions 24P.

Referring now to FIG. 3, there is illustrated the exemplary semiconductor structure of FIG. 2 after extending the opening 26 in the material stack 10 into the bottom sacrificial spacer material 18 to expose a portion of a topmost surface of the second semiconductor material 16. Opening 26 can now be referred to as an extended opening 28. Extended opening 28 can be performed utilizing an anisotropic etch that is selective for removing the dielectric material that provides the bottom sacrificial spacer material 18. After forming the extended opening 28, portions of the bottom sacrificial spacer material 18 remain. The remaining portions of the bottom sacrificial spacer material 18 may now be referred to as bottom sacrificial spacer material portions 18P.

As shown in FIG. 3, sidewall surfaces of each first hard mask portion 24P, each top sacrificial spacer material portion 22P, each sacrificial gate material portion 20P, and each bottom sacrificial spacer material portions 18P are vertically aligned to each other.

In some embodiments of the present application, an extension implant may now be performed in the extended opening 28 to provide a source/drain extension region (not shown) within the exposed portion of the second semiconductor material 16. In such an embodiment, the outermost edges of the source/drain extension region (not shown) are vertically aligned to the sidewall surfaces of each first hard mask portion 24P, each top sacrificial spacer material portion 22P, each sacrificial gate material portion 20P, and each bottom sacrificial spacer material portions 18P.

Referring now to FIG. 4, there is illustrated the exemplary semiconductor structure of FIG. 3 after forming an oxide liner 30 into exposed sidewalls of each remaining portion of the sacrificial gate material (i.e., the sacrificial gate material portions 20P) in the extended opening 28. The oxide liner 30 can be formed utilizing an oxidation process such as, for example, a plasma oxidation process, thermal oxidation process or a chemical oxidation process. The oxidation process used to form the oxide liner 30 converts the exposed portion of each sacrificial gate material portion 20P into the oxide liner 30. The oxide liner 30 that is formed thus has a sidewall surface that is vertically aligned to the sidewall surfaces of each first hard mask portion 24P, each top sacrificial spacer material portion 22P, and each bottom sacrificial spacer material portions 18P.

Referring now to FIG. 5, there is illustrated the exemplary semiconductor structure of FIG. 4 after forming an epitaxial semiconductor channel material 32 from the exposed topmost surface of the second semiconductor material 16. As is shown, the epitaxial semiconductor channel material 32 completely fills the extended opening 28 and has a topmost surface that is coplanar with a topmost surface of the first hard mask portions 24P.

The epitaxial semiconductor channel material 32 may include one of the semiconductor materials mentioned above for the base semiconductor substrate 12. In some embodiments, the semiconductor material that provides the epitaxial semiconductor channel material 32 may comprise a same semiconductor material as the second semiconductor material 16. For example, the epitaxial semiconductor channel material 32 and the second semiconductor material 16 may both be composed of silicon. In another embodiment, the epitaxial semiconductor channel material 32 may comprise a different semiconductor material than the second semiconductor material 16. For example, the epitaxial semiconductor channel material 32 may be composed of a high mobility channel material such as, for example, germanium, a silicon germanium alloy or a III-V compound semiconductor, while the second semiconductor material 16 may be composed of silicon.

The epitaxial semiconductor channel material 32 may be formed utilizing an epitaxial growth (or deposition) process as defined above. The epitaxial semiconductor channel material 32 thus has an epitaxial relationship with the exposed topmost surface of the second semiconductor material 16. In some embodiments and following the epitaxial growth process, a planarization process such as, for example, chemical mechanical polishing (CMP), may be employed in providing the epitaxial semiconductor channel material 32.

Referring now to FIG. 6, there is illustrated the exemplary semiconductor structure of FIG. 5 after recessing the epitaxial semiconductor channel material 32 and forming a second hard mask material 34, which has a different etch selectivity than the first hard mask material 24, on the remaining portion of the epitaxial semiconductor channel material 32 (the remaining portion of the epitaxial semiconductor material constitutes an epitaxial semiconductor channel material structure 32S of the present application).

The recessing of the epitaxial semiconductor channel material 32 may be performed utilizing an etching process that is selective in removing the semiconductor material that provides the epitaxial semiconductor channel material 32. In one embodiment, recessing may be performed utilizing a timed reactive ion etch. The epitaxial semiconductor channel material structure 32S that is formed has a topmost surface that is located between the topmost surface and the bottommost surface of each first hard mask material portion 24P.

As mentioned above, the second hard mask material 34 has a different etch selectivity than the first hard mask material 24. Hence, the second hard mask material 34 is composed of a different hard mask material than the first hard mask material 24. In one example, the second hard mask material 34 may be composed of silicon nitride, while the first hard mask material 24 may be composed of silicon dioxide. The second hard mask material 34 can be formed utilizing a deposition process such as, for example, chemical vapor deposition or plasma enhanced chemical vapor deposition. A planarization process such as, for example, chemical mechanical polishing (CMP), may follow the deposition of the hard mask material that provides the second hard mask material 34 of the exemplary semiconductor structure of the present application.

As is shown, the second hard mask material 34 is formed on the topmost surface of the epitaxial semiconductor channel material structure 32S. As is further shown, sidewall surfaces of the second hard mask material 34 are vertically aligned with the sidewall surfaces of the underlying epitaxial semiconductor channel material structure 32S.

Referring now to FIGS. 7A-7B, there are illustrated various views of the exemplary semiconductor structure of FIG. 6 after removing the remaining portions of the first hard mask material (i.e., each first hard mask portion 24P), laterally recessing exposed portions of the remaining portion of the epitaxial semiconductor channel material (i.e., the epitaxial semiconductor channel material structure 32S), and epitaxially growing a top source/drain region (or structure) 36.

Each first hard mask portion 24P may be removed utilizing an etching process that is selective in removing the first hard mask material stopping on the top sacrificial spacer material portions 22P. In one example, and when the first hard mask material portions 24P comprises silicon dioxide, aqueous hydrofluoric acid may be employed as an etchant. The removal of each first hard mask portion 24P exposes an upper portion of the epitaxial semiconductor channel material structure 32S. The exposed upper portion of the epitaxial semiconductor channel material structure 32S is then subjected to a lateral etch (i.e., recessing) process to provide an epitaxial semiconductor channel material structure 32S that now contains a lower portion 32A of a first thickness and an upper portion 32B of a second thickness that is less than the first thickness.

Next, the top source/drain region 36 is epitaxially grown from each exposed sidewall surface of the upper portion 32B of the epitaxial semiconductor channel material structure 32S. The epitaxial growth (or deposition) used to provide the top source/drain region 36 is as defined above. The top source/drain region 36 includes a semiconductor material and a dopant (n-type or p-type) as defined above. The dopant can be added during the epitaxial growth of the top source/drain region 36 or after utilizing a gas phase doping process. The semiconductor material that provides the top source/drain region 36 may be the same as, or different from, the semiconductor material that provides the epitaxial semiconductor channel material structure 32S. In some embodiments, and as shown, the top source/drain region 36 may have faceted surfaces, i.e., non-planar surfaces. In some embodiments and as shown, each top source/drain region 36 is triangular in shape, wherein the base of the triangle directly contacts one of the sidewalls of the upper portion 32B of the epitaxial semiconductor channel material structure 32S and the tip of the triangle extends outward from the one sidewall of the upper portion 32B of the epitaxial semiconductor channel material structure 32S. In some embodiments, and as shown, the tip of each triangular may extend beyond the sidewall surfaces of the bottom portion 32A of the epitaxial semiconductor channel material structure 32S.

During the epitaxial growth process and as shown, a portion of the top source/drain region 36 may contact an exposed topmost surface of the bottom portion 32A of the epitaxial semiconductor channel material structure 32S; epitaxial growth is prevented from the topmost surface of the upper portion 32B of the epitaxial semiconductor channel material structure 32S due to the presence of the second hard mask material 34.

Figure 8B:
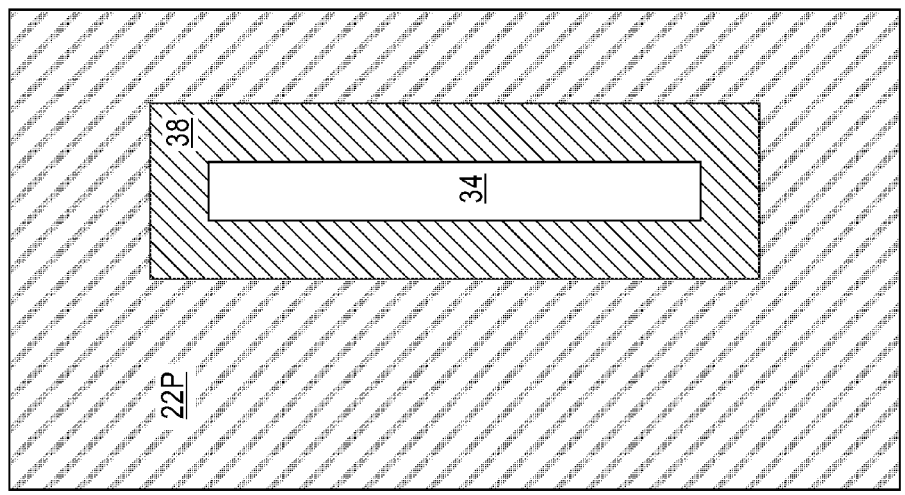
FIG. 8B is a top down view of the exemplary semiconductor structure shown in FIG. 8A.
Figure 8A:
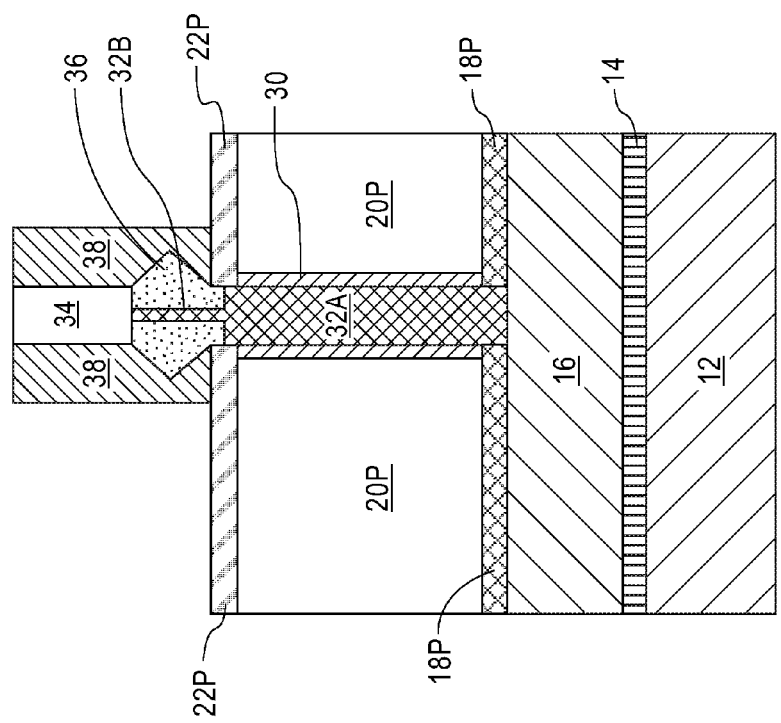
FIG. 8A is a cross sectional view of the exemplary semiconductor structure of FIGS. 7A-7B after forming a dielectric spacer protecting the top source/drain region.

Referring now to FIGS. 8A-8B, there are illustrated various views of the exemplary semiconductor structure of FIGS. 7A-7B after forming a dielectric spacer 38 protecting the top source/drain region 36. Dielectric spacer 38 may include any dielectric spacer material including, for example, silicon dioxide, silicon nitride and/or silicon oxynitride. The dielectric spacer material that provides the dielectric spacer 38 is composed of a different material than at least the top sacrificial spacer material 22. The dielectric spacer 38 may be formed utilizing a deposition process, followed by a spacer etch.

Figure 9B:
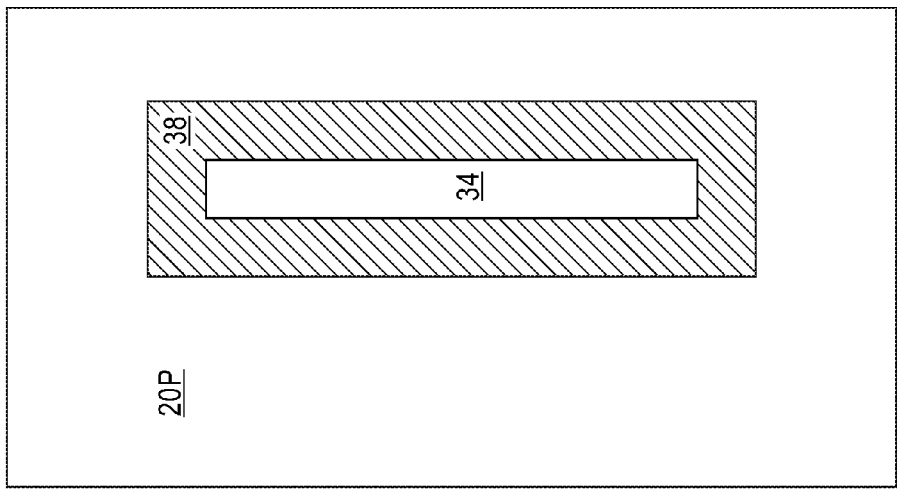
FIG. 9B is a top down view of the exemplary semiconductor structure shown in FIG. 9A.
Figure 9A:
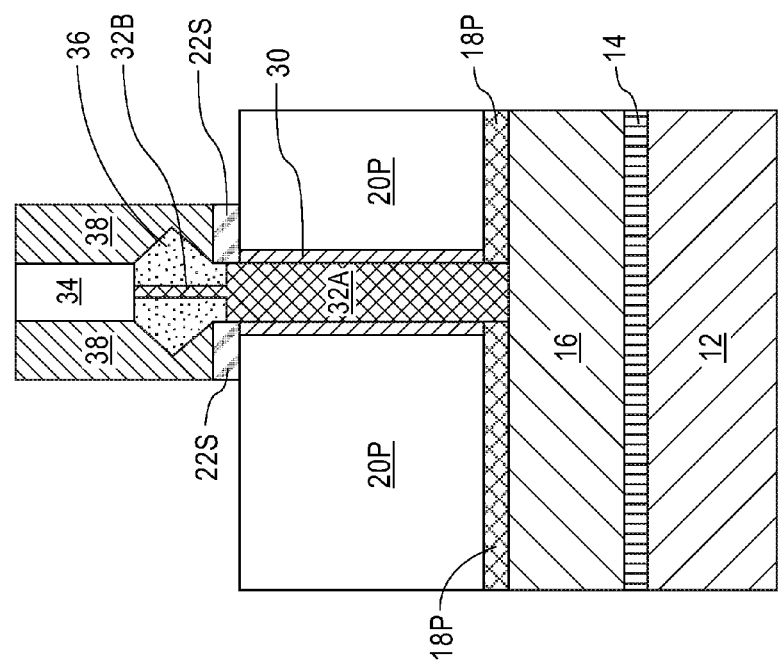
FIG. 9A is a cross sectional view of the exemplary semiconductor structure of FIGS. 8A-8B after removing exposed portions of remaining portions of the top sacrificial spacer material.

Referring now to FIGS. 9A-9B, there are illustrated various views of the exemplary semiconductor structure of FIG. 8A after removing exposed portions of remaining portions of the top sacrificial spacer material (i.e., the top sacrificial spacer material portion 22P). The removal of the exposed portions of each top sacrificial spacer material portions 22P can be performed utilizing an anisotropic etch in which the dielectric spacer 28 and the second hard mask material 34 are used as a combined etch mask.

As is shown, portions of each top sacrificial spacer material portion 22P remain beneath the dielectric spacer 38. The remaining portions of the top sacrificial spacer material portions 22P may be referred to herein as top sacrificial spacer material structures 22S. As is shown, an outermost sidewall surface of each top sacrificial spacer material structures 22S is vertically aligned to the outermost sidewall surface of the overlying dielectric spacer 38.

Figure 10:
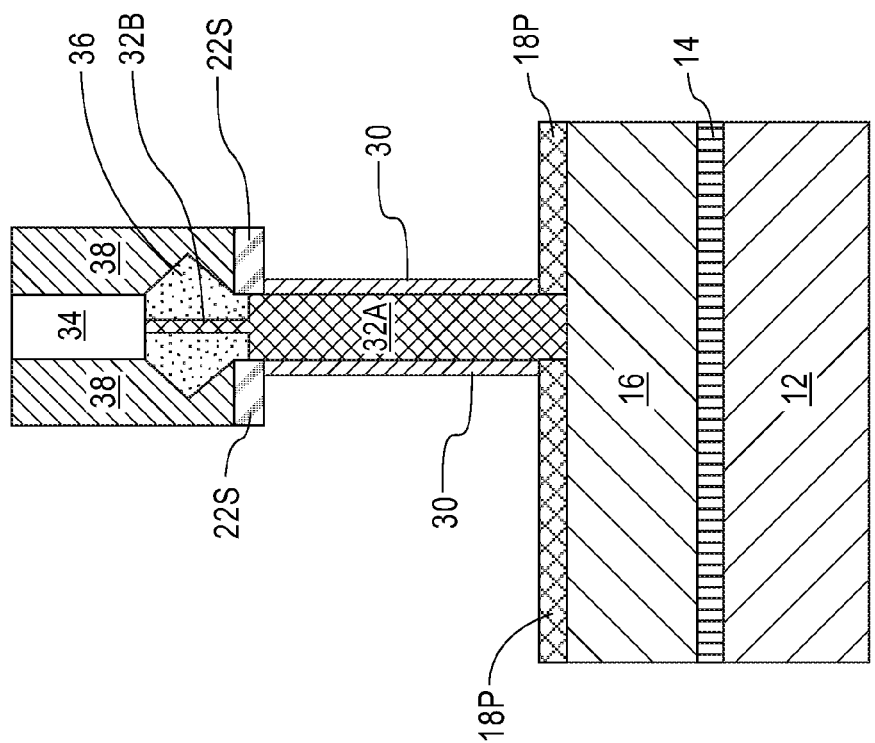
FIG. 10 is a cross sectional view of the exemplary semiconductor structure of FIGS. 9A-9B after removing the remaining portions of the sacrificial gate material.

Referring now to FIG. 10, there is illustrated the exemplary semiconductor structure of FIGS. 9A-9B after removing the remaining portions of the sacrificial gate material (i.e., the sacrificial gate material structure portions 20P). The sacrificial gate material structure portions 20P may be removed utilizing a single etching process or a combination of etching processes may be used. The removal of each sacrificial gate material structure portion 20P exposes a topmost surface of each bottom sacrificial spacer material portion 18P and an outer sidewall of the oxide liner 30 that protects the lower portion 32A of the epitaxial semiconductor channel material structure 32S.

Figure 11:
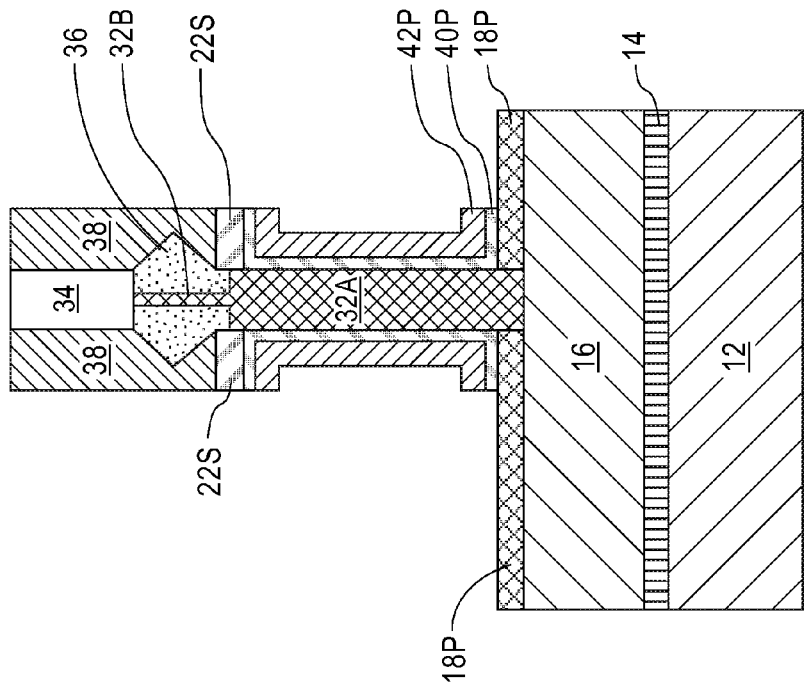
FIG. 11 is cross sectional view of the exemplary semiconductor structure of FIG. 10 after removing the oxide liner, and then forming a gate stack of, from bottom to top, a gate dielectric material and a first gate conductor material.

Referring now to FIG. 11, there is illustrated the exemplary semiconductor structure of FIG. 10 after removing the oxide liner 30, and then forming a gate stack of, from bottom to top, a gate dielectric material 40 and a first gate conductor material 42.

The removal of the oxide liner 30 may be performed utilizing an etching process that is selective in removing the oxide liner 30. In one embodiment of the present application, the oxide liner 30 may be removed utilizing aqueous hydrofluoric acid as an etchant. The removal of the oxide liner 30 exposes the sidewall surfaces of the lower portion 32A of the epitaxial semiconductor channel material structure 32S.

Next, a gate dielectric material 40 is formed over the entire structure; the gate dielectric material 40 is a conformal layer that follows the contour of the structure. The gate dielectric material 40 can be an oxide, nitride, and/or oxynitride. In one example, the gate dielectric material 40 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric material 40. The gate dielectric material 40 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material 40 can have a thickness in a range from 1 nm to 10 nm. Other thicknesses that are lesser than, or greater than, the aforementioned thickness range can also be employed for the gate dielectric material 40.

The first gate conductor material 42 is then formed on the gate dielectric material 40. The first gate conductor material 42 is also a conformal layer and can include a gate conductor material. The gate conductor material used in providing the first gate conductor material 42 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the first gate conductor material 42 may comprise an nFET gate metal. In another embodiment, the first gate conductor material 42 may comprise a pFET gate metal. The gate conductor material used in providing the first gate conductor material 42 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the first gate conductor material 42 can have a thickness from 50 nm to 200 nm. Other thicknesses that are lesser than, or greater than, the aforementioned thickness range can also be employed for the first gate conductor material 42.

Figure 12:
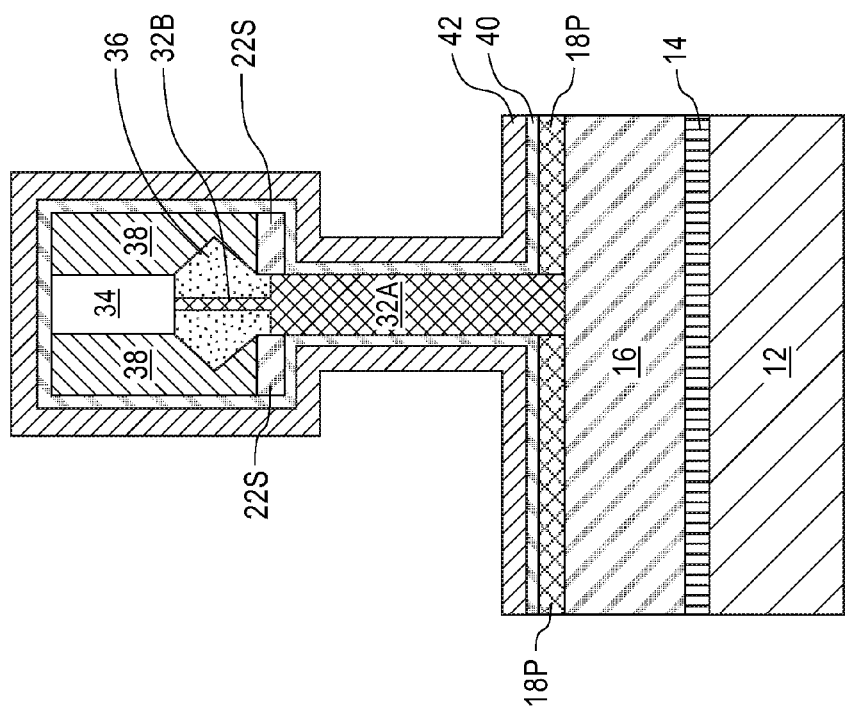
FIG. 12 is a cross sectional view of the exemplary semiconductor structure of FIG. 11 after patterning the gate stack.

Referring now to FIG. 12, there is illustrated the exemplary semiconductor structure of FIG. 11 after patterning the gate stack (40, 42). The patterning of the gate stack provides a gate dielectric material portion 40P and a first gate conductor material portion 42P on each side of the lower portion 32A of the epitaxial semiconductor channel material structure 32S. Specifically, and as shown, a gate dielectric material portion 40P and a first gate conductor material portion 42P are present on opposing sidewall surfaces of the lower portion 32A of the epitaxial semiconductor channel material structure 32S. As is also shown, each gate dielectric material portion 40P is located on a sidewall surface, a topmost surface and a bottommost surface of the first gate conductor material portion 42P. The patterning of the gate stack which provides the gate dielectric material portion 40P and the first gate conductor material portion 42P on each side of the lower portion 32A of the epitaxial semiconductor channel material structure 32S may be performed utilizing an anisotropic etch utilizing the dielectric spacer 38 and the second hard mask material 34 as a combined etch mask.

Figure 13B:
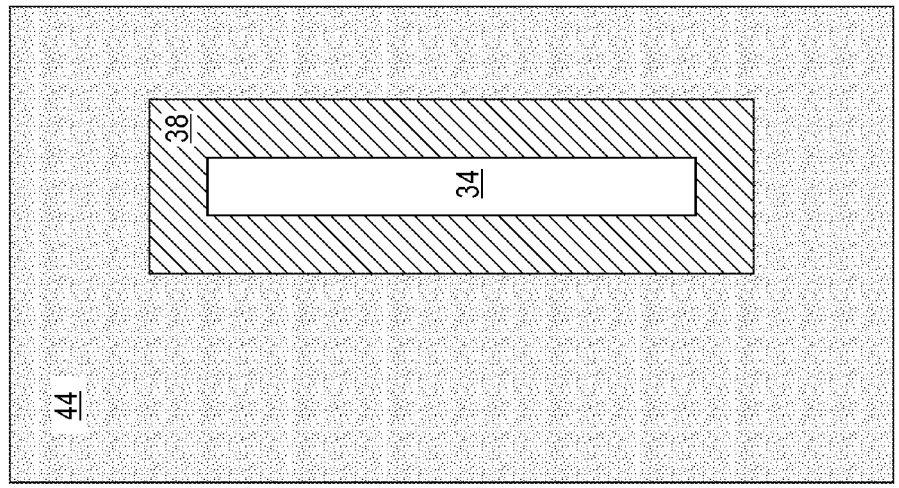
FIG. 13B is a top down view of the exemplary semiconductor structure of FIG. 13A.
Figure 13A:
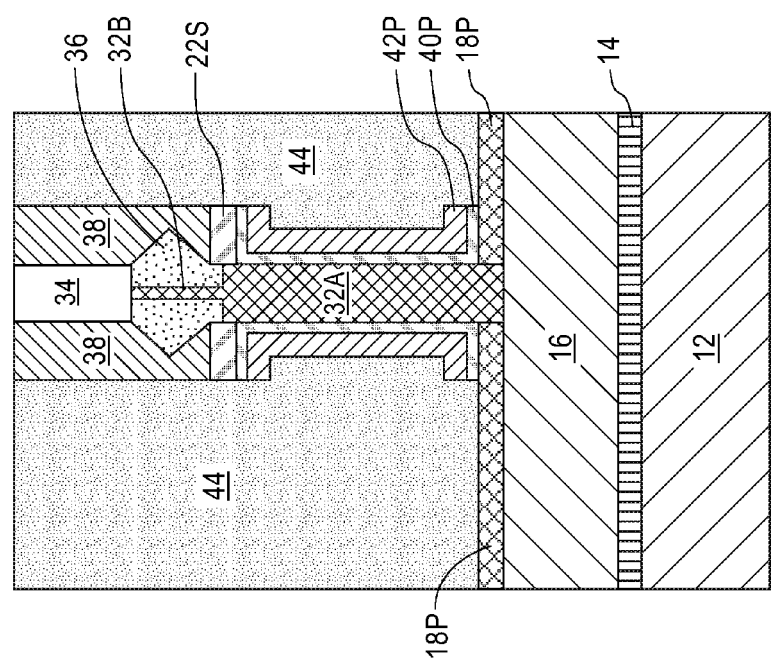
FIG. 13A is a cross sectional view of the exemplary semiconductor structure of FIG. 12 after forming a second gate conductor material.

Referring now to FIGS. 13A-13B, there are illustrated various views of the exemplary semiconductor structure of FIG. 12 after forming a second gate conductor material 44 on each side of the epitaxial semiconductor channel material structure 32S. The second gate conductor material 44 comprises one of the conductor materials mentioned above for the first gate conductor material 40. Typically, but not necessarily always, the second gate conductor material 44 comprises a different gate conductor material than the first conductor material 40. For example, the first gate conductor material 40 may include an nFET gate metal or a pFET gate metal and the second gate conductor material 44 may comprise polysilicon or an elemental metal such as tungsten.

The second gate conductor material 44 can be formed by one of the deposition processes mentioned above in forming the first gate conductor material 40. A planarization process such as, for example, CMP, may be employed after depositing the second gate conductor material 44. At this point of the present application, and as shown in FIG. 13A, the topmost surface of the second gate conductor material 44 is coplanar with a topmost surface of both the dielectric spacer 38 and the second hard mask material 34.

Figure 14:
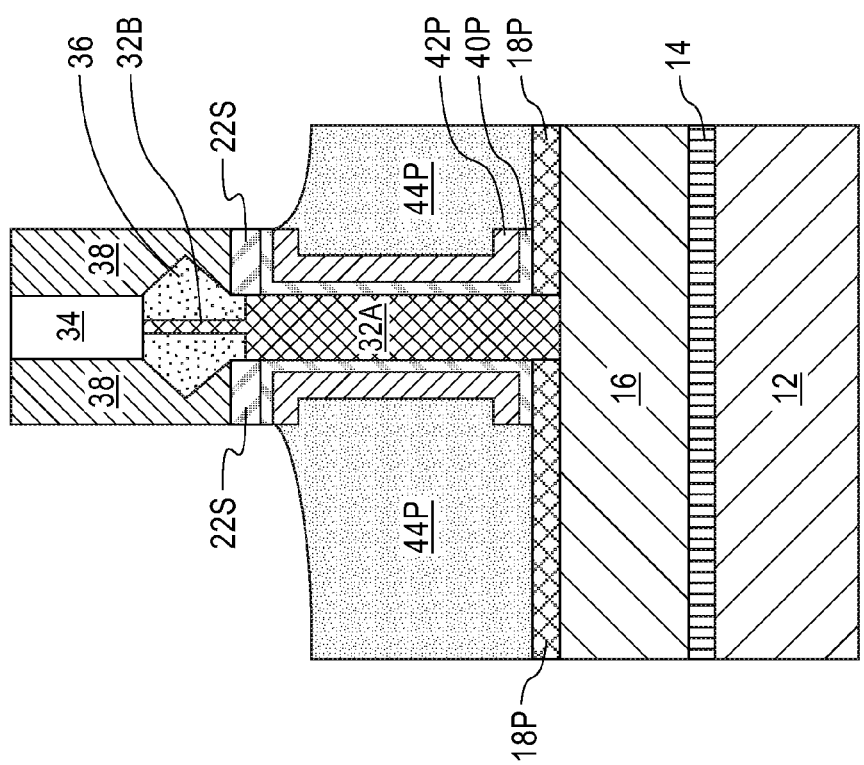
FIG. 14 is a cross sectional view of the exemplary semiconductor structure of FIGS. 13A-13B after recessing the second gate conductor material.

Referring now to FIG. 14, there is illustrated the exemplary semiconductor structure of FIG. 13A after recessing the second gate conductor material 44 to provide a recessed second gate conductor material 44P on each side of the epitaxial semiconductor channel material structure 32S. The recessing of the second gate conductor material 44 may be performed utilizing an etch back process that is selective in removing the second gate conductor material 44. In some embodiments and as illustrated, the topmost surface of each recessed second gate conductor material 44P is undulating, i.e., wavy.

Figure 15B:
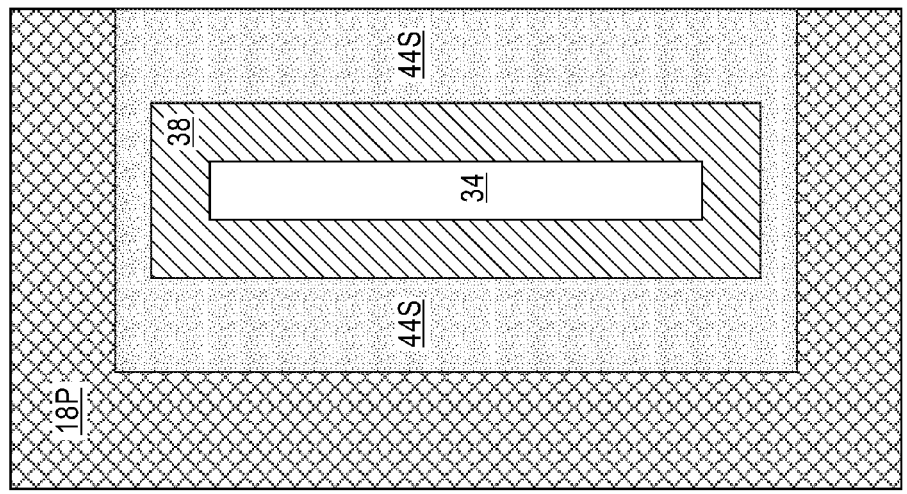
FIG. 15B is a top down view of the exemplary semiconductor structure of FIG. 15A.
Figure 15A:
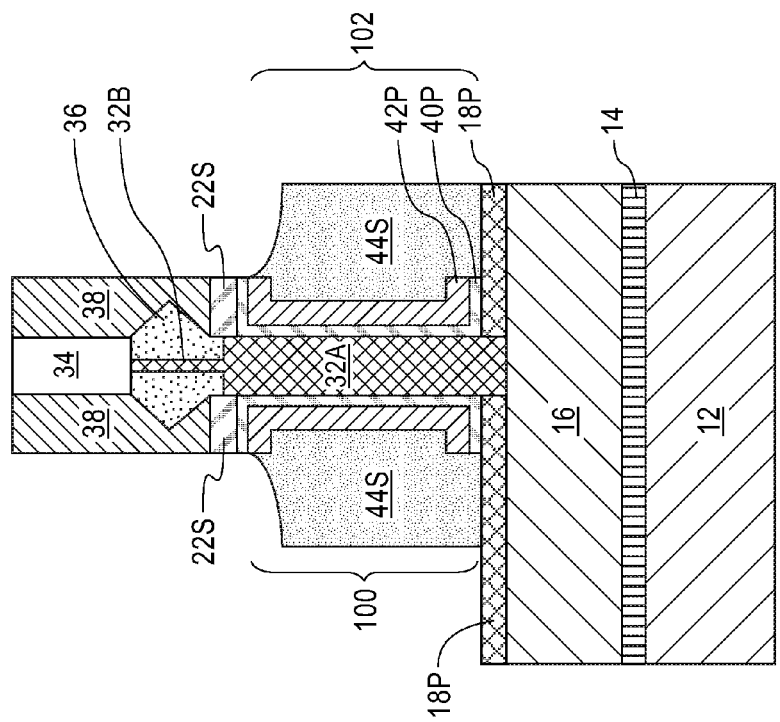
FIG. 15A is a cross sectional view of the exemplary semiconductor structure of FIG. 14 after patterning the remaining portion of the second gate conductor material.

Referring now to FIGS. 15A-15B, there are illustrated various views of the exemplary semiconductor structure of FIG. 14 after patterning the remaining portion of the second gate conductor material (i.e., each recessed second conductor material 44P) to provide a second gate conductor material portion 44S on each side of the epitaxial semiconductor channel material structure 32S. The patterning of each recessed second conductor material 44P may be performed by lithography and etching as defined above.

As is shown, a first functional gate structure 100 is located on a first side of the bottom portion 32A of the epitaxial semiconductor channel material structure 32S, and a second functional gate structure 102 is located on a second side, opposite to the first side, of the bottom portion 32A of the epitaxial semiconductor channel material structure 32S. By "functional gate structure" it is meant a permanent gate structure used to control output current (i.e., flow of carriers in the channel) of a semiconducting device through electrical or magnetic fields.

Figure 16B:
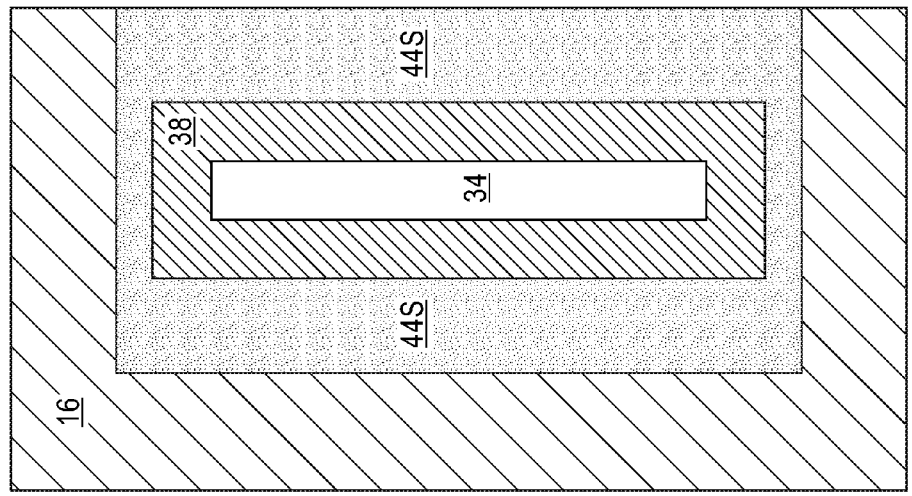
FIG. 16B is a top down view of the exemplary semiconductor structure of FIG. 16A.
Figure 16A:
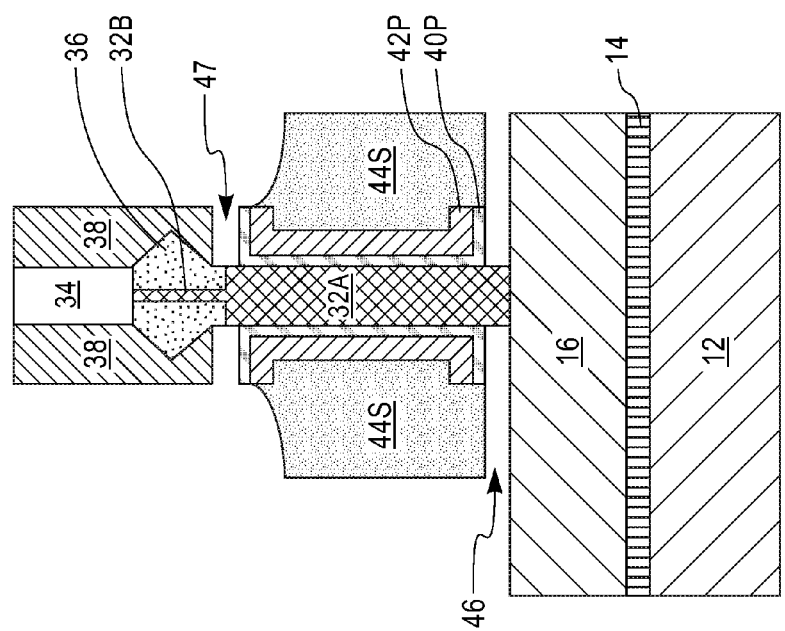
FIG. 16A is a top down view of the exemplary semiconductor structure of FIGS. 15A-15B after removing all remaining portions of the top and bottom sacrificial spacer materials.

Referring now to FIGS. 16A-16B, there are illustrated various views of the exemplary semiconductor structure of FIGS. 15A-15B after removing all remaining portions of the top and bottom sacrificial spacer materials (i.e., each top sacrificial spacer material structure 22S, and each bottom sacrificial spacer material structure 18P). The removal of each top sacrificial spacer material structure 22S provides a top gap 47 located between a topmost surface of each gate dielectric material portion 40P of the first and second functional gate structures 100, 102 and a portion of the top source/drain region 36. The removal of each bottom sacrificial spacer material structure 18P provides a bottom gap 46 between the bottommost surface of each gate dielectric material portion 40P of the first and second functional gate structures 100, 102 and a topmost surface of the second semiconductor material 16 (i.e., the bottom source/drain region).

In one embodiment of the present application, the removal of each top sacrificial spacer material structure 22S and each bottom sacrificial spacer material structure 18P may be performed utilizing a single etch. In another embodiment of the present application, the removal of each top sacrificial spacer material structure 22S and each bottom sacrificial spacer material structure 18P may be performed utilizing two different etching processes. In either instance, the etch employed is selective in removing the spacer material that provides each top sacrificial spacer material structure 22S and each bottom sacrificial spacer material structure 18P relative to the other materials of the exemplary semiconductor structure.

Figure 17:
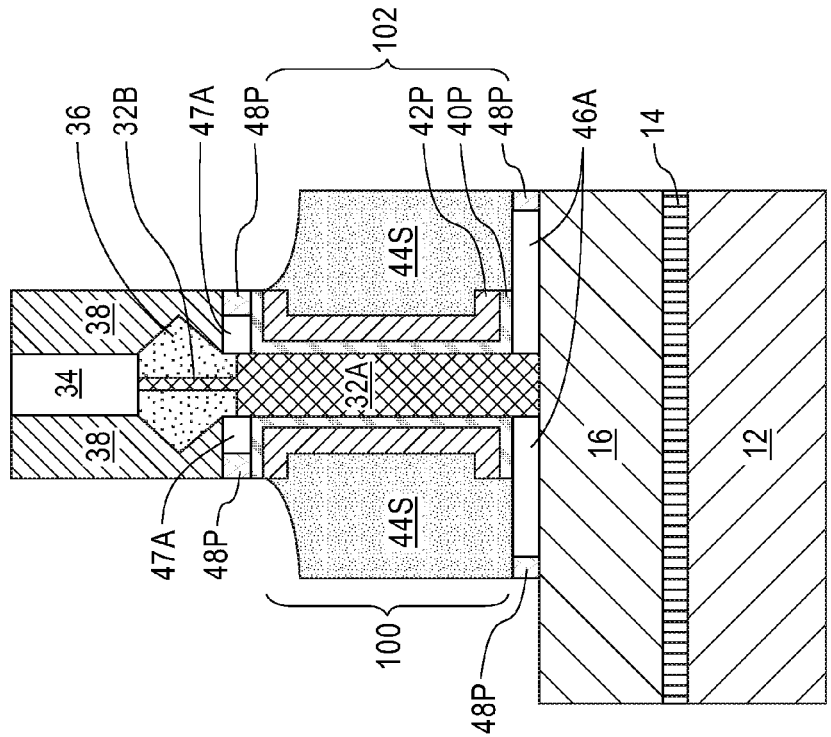
FIG. 17 is a cross sectional view of the exemplary semiconductor structure of FIGS. 16A-16B after forming a dielectric air gap liner.

Referring now to FIG. 17, there is illustrated the exemplary semiconductor structure of FIGS. 16A-16B after forming a dielectric air gap liner 48. The dielectric air gap liner 48 may comprise any dielectric material including, but not limited to, dielectric materials that have a dielectric constant of less than silicon dioxide. In one example, the dielectric material that can be used as the dielectric air gap liner 48 and having a dielectric constant of less than silicon dioxide may include a dielectric material that contains atoms of Si, C, O, and H; N atoms may optionally be present. The dielectric air gap liner 48 can be formed utilizing a deposition process such as, for example, chemical vapor deposition or plasma enhanced chemical vapor deposition. Some dielectric air gap liner 48 may form on the exposed portion of the bottom portion 32A of the epitaxial semiconductor channel material structure 32S. The dielectric air gap liner 48 may have a thickness from 10 nm to 25 nm. Other thicknesses that are greater than or lesser than the aforementioned thickness range may also be used as the thickness of the dielectric air gap liner 48.

Figure 18:
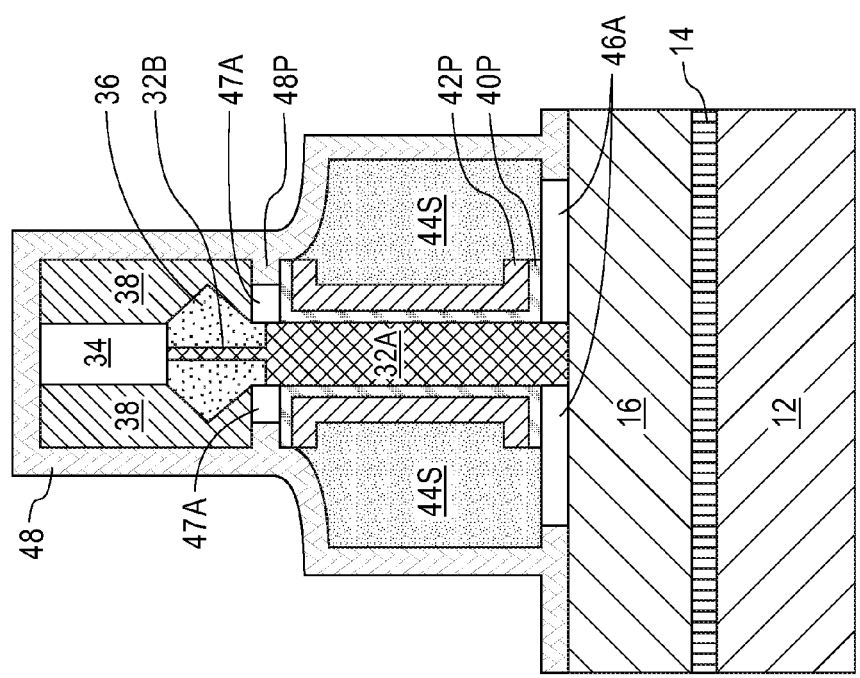
FIG. 18 is a cross sectional view of the exemplary semiconductor structure of FIG. 17 after removing exposed portions of the dielectric air gap liner.

Referring now to FIG. 18, there is illustrated the exemplary semiconductor structure of FIG. 17 after removing exposed portions of the dielectric air gap liner 48 to provide dielectric air gap portions 48P sealing an outer edge of each bottom air gap spacer 46A and an outer edge of each top air gap spacer 47A. The removal of the exposed portions of the dielectric air gap liner 48 may be performed utilizing an anisotropic etch.

Notably, FIG. 18 (and FIGS. 19A, 19B, 20A and 20B to follow) illustrates an exemplary semiconductor structure of the present application. The exemplary semiconductor structure includes an epitaxial semiconductor channel material structure (32A, 32B) extending from a topmost surface of a bottom source/drain region (i.e., the second semiconductor material of the second conductivity type 16). The epitaxial semiconductor channel material structure has a bottom portion 32A of a first thickness and an upper portion 32B of a second thickness that is less than the first thickness. The semiconductor structure further includes a first functional gate structure (e.g., element 100) located on one side of the epitaxial semiconductor channel material structure (32A, 32B) and directly contacting a portion of a first sidewall of the bottom portion 32A of the epitaxial semiconductor channel material structure, and a second functional gate structure (e.g., 102) located on another side of the epitaxial semiconductor channel material structure (32A, 32B) and directly contacting a portion of a second sidewall of the bottom portion 32A of the epitaxial semiconductor channel material structure, the second sidewall is opposite the first sidewall. A top source/drain region 36 extends from a sidewall of the top portion 32B of the epitaxial semiconductor channel material structure. The exemplary semiconductor structure further includes a bottom air gap spacer 46A located between a bottommost surface of the first and second functional gate structures (100, 102) and the topmost surface of the bottom source/drain region (i.e., the second semiconductor material of the second conductivity type 16), and a top air gap spacer 47A located between a topmost surface of the first and second functional gate structures (100, 102) and a surface of the top source/drain region 36.

Figure 19B:
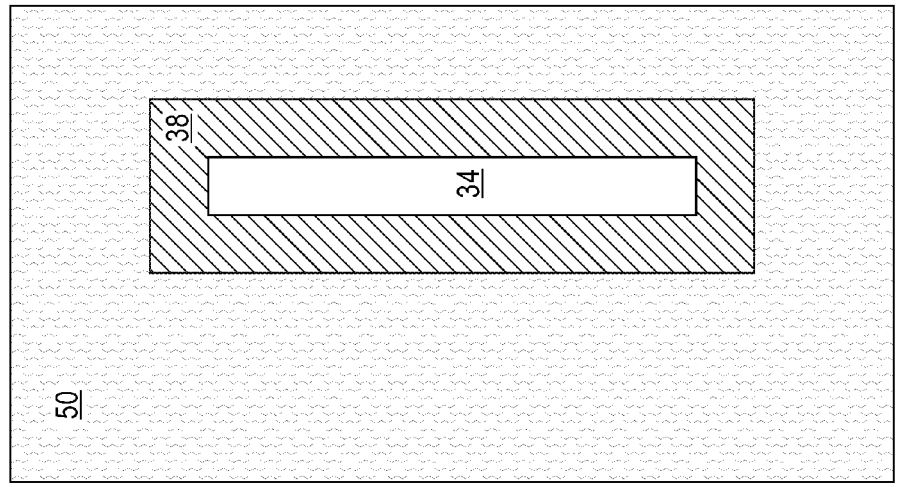
FIG. 19B is a top down view of the exemplary semiconductor structure of FIG. 19A.
Figure 19A:
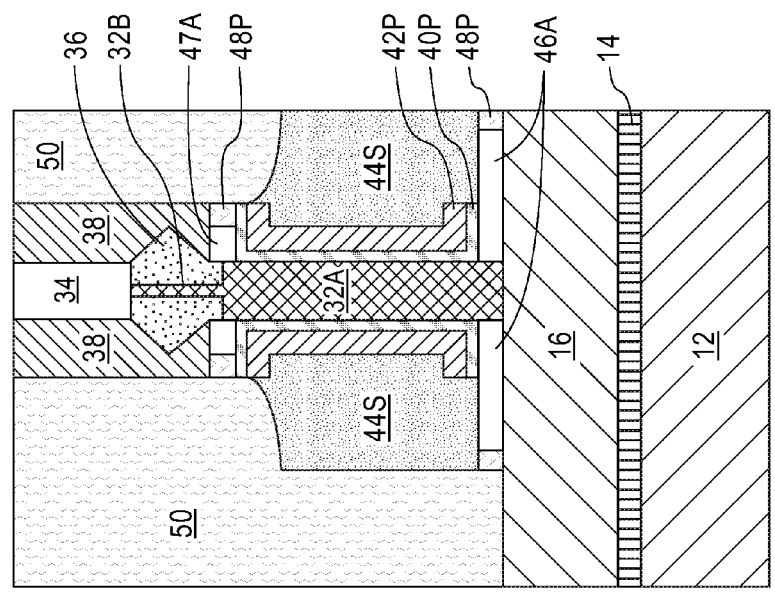
FIG. 19A is a cross sectional view of the exemplary semiconductor structure of FIG. 18 after forming an interlevel dielectric (ILD) material.

Referring now to FIGS. 19A-19B, there are illustrated various views of the exemplary semiconductor structure of FIG. 18 after forming an interlevel dielectric (ILD) material 50. As is shown, the ILD material 50 surrounds the first and second functional gate structures 100, 102. As is further shown, the ILD material 50 has a topmost surface that is coplanar with a topmost surface of each dielectric spacer 38 and the second hard mask material 34.

The ILD material 50 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material 50. The use of a self-planarizing dielectric material as the ILD material 50 may avoid the need to perform a subsequent planarizing step.

In one embodiment, the ILD material 50 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material 50, a planarization process or an etch back process follows the deposition of the dielectric material that provides the ILD material 50.

Figure 20B:
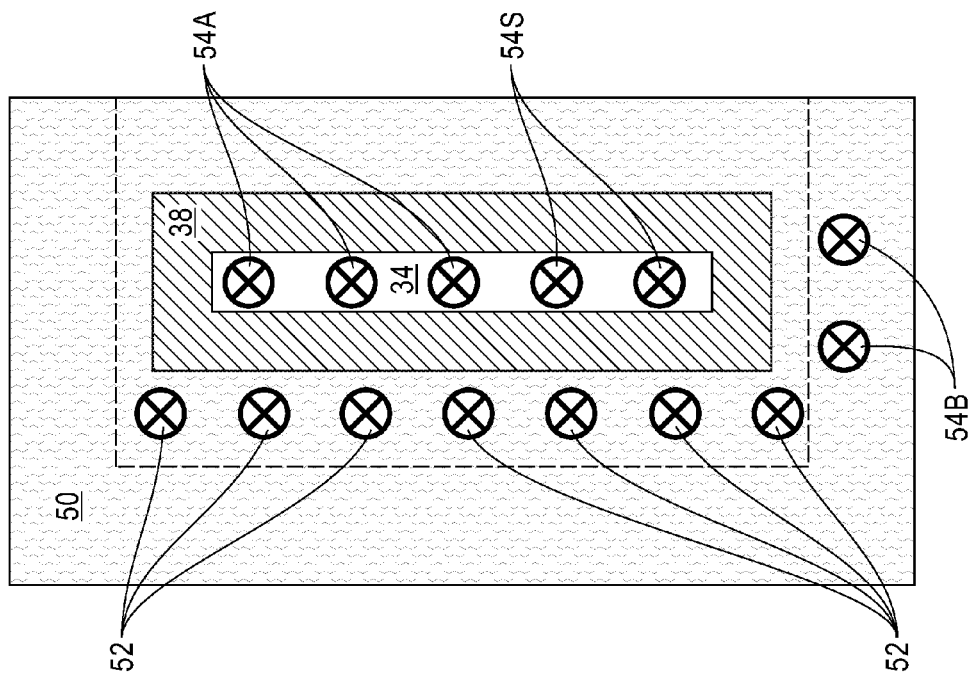
FIG. 20B is a top down view of the exemplary semiconductor structure of FIG. 20A.
Figure 20A:
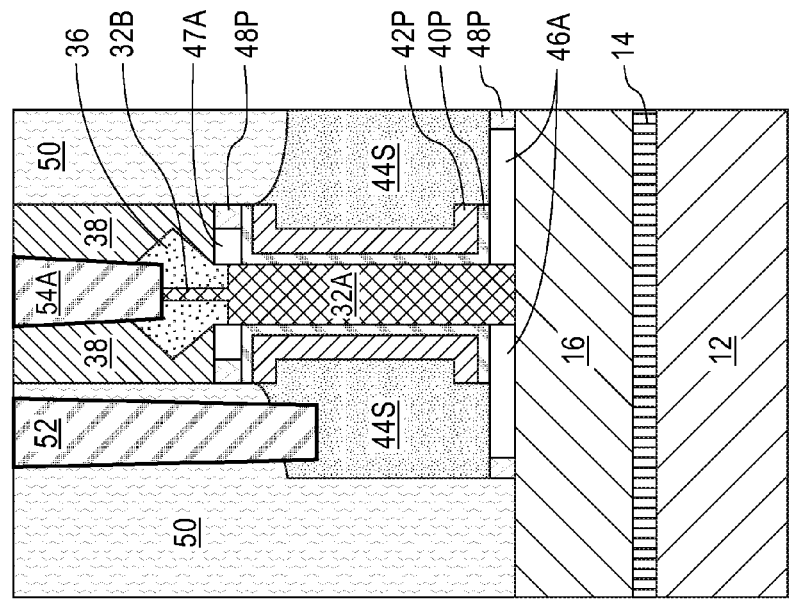
FIG. 20A is a cross sectional view of the exemplary semiconductor structure of FIGS. 19A-19B after forming various contact structures.

Referring now to FIGS. 20A-20B, there are illustrated various views of the exemplary semiconductor structure of FIGS. 19A-19B after forming various contact structures. Notably, there is shown the structure after forming, in any order, a gate contact structure 52 extending through the (ILD) material 50 and contacting the second gate conductor material portion 44S of one of the first or second functional gate structure 100, a first source/drain contact structure 54B contacting the bottom source/drain region (i.e., the second semiconductor material 16) and a second source/drain contact structure 54A contacting the top source/drain region 36.

The various contact structures can be formed by first providing a contact opening within the MOL material 50. Lithography and etching, as defined above, can be used to provide each contact opening. Each contact opening is then filled with at least a contact metal such as, for example, copper, tungsten or a copper-tungsten alloy. In some embodiments, a metal semiconductor alloy, i.e., a silicide, may be formed prior to filling each contact opening with a contact metal.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A semiconductor structure comprising:
an epitaxial semiconductor channel material structure extending from a topmost surface of a bottom source/drain region, said epitaxial semiconductor channel material structure having a bottom portion of a first thickness and an upper portion of a second thickness that is less than the first thickness;
a first functional gate structure located on one side of the epitaxial semiconductor channel material structure;

a second functional gate structure located on another side of the epitaxial semiconductor channel material structure;

a top source/drain region extending from a sidewall of said top portion of said epitaxial semiconductor channel material structure and contacting exposed portions of a topmost surface of said lower portion of said epitaxial semiconductor channel material structure;

a bottom air gap spacer located between a bottommost surface of said first and second functional gate structures and said topmost surface of said bottom source/drain region; and a top air gap spacer located between a topmost surface of said first and second functional gate structures and a surface of said top source/drain region.

2. The semiconductor structure of claim 1, further comprising an interlevel dielectric (ILD) material surrounding said first and second functional gate structures.

3. The semiconductor structure of claim 2, further comprising a gate contact structure extending through said (ILD) material and contacting at least one of said first or second functional gate structures.

4. The semiconductor structure of claim 3, further comprising a first source/drain contact structure contacting said bottom source/drain region and a second source/drain contact structure contacting said top source/drain region.

5. The semiconductor structure of claim 1, further comprising a dielectric air gap portion sealing an outer edge of said bottom air gap spacer and an outer edge of said top air gap spacer.

6. The semiconductor structure of claim 2, wherein a bottommost surface of the ILD material contacts another portion of said topmost surface of said bottom source/drain region.

7. The semiconductor structure of claim 1, further comprising a dielectric spacer protecting a portion of each top source/drain region.

8. The semiconductor structure of claim 1, wherein each of said first and second functional gate structures comprises a gate dielectric material portion, a first gate conductor material portion and a second gate conductor material portion.

9. The semiconductor structure of claim 1, wherein said gate dielectric material portion is located on a sidewall surface, a topmost surface and a bottommost surface of said first gate conductor material portion.

10. The semiconductor structure of claim 1, wherein said bottom source/drain region comprises a second semiconductor material of a second conductivity type that is located on a topmost surface of a first semiconductor material of a first conductivity type, wherein the second conductivity type is opposite said first conductivity type.

11. A method of forming a semiconductor structure, said method comprising:

forming an epitaxial semiconductor channel material structure extending from a topmost surface of a bottom source/drain region, said epitaxial semiconductor channel material structure having a bottom portion of a first thickness and an upper portion of a second thickness that is less than the first thickness;

forming a top source/drain region extending from a sidewall of said top portion of said epitaxial semiconductor channel material structure and contacting exposed portions of a topmost surface of said lower portion of said epitaxial semiconductor channel material structure;

forming a first functional gate structure on one side of the epitaxial semiconductor channel material structure, and a second functional gate structure on another side of the epitaxial semiconductor channel material structure; and forming a bottom air gap spacer between a bottommost surface of said first and second functional gate structures and said topmost surface of said bottom source/drain region, and a top air gap spacer between a topmost surface of said first and second functional gate structures and a surface of said top source/drain region.

12. The method of claim 11, further comprising forming an interlevel dielectric (ILD) material surrounding said first and second functional gate structures.

13. The method of claim 12, further comprising forming a gate contact structure extending through said (ILD) material and contacting at least one of said first or second functional gate structures.

14. The method of claim 13, further comprising forming a first source/drain contact structure contacting said bottom source/drain region and a second source/drain contact structure contacting said top source/drain region.

15. The method of claim 11, wherein said forming said epitaxial semiconductor channel material structure comprises:

forming a material stack including at least said bottom source/drain channel region comprising a semiconductor material having an n-type or p-type conductivity type, a bottom sacrificial spacer material, a sacrificial gate material, a top sacrificial spacer material, and a first hard mask material;

forming an opening in said material stack to expose a portion of a topmost surface of said second semiconductor material;

forming an oxide liner into exposed sidewalls of each remaining portion of said sacrificial gate material in said opening;

forming an epitaxial semiconductor channel material from said exposed topmost surface of said second semiconductor material;

recessing said epitaxial semiconductor channel material;

forming a second hard mask material, that which has a different etch selectivity than said first hard mask material, on said remaining portion of said epitaxial semiconductor channel material;

removing said remaining portions of said first hard mask material; and laterally recessing exposed portions of said remaining portion of said epitaxial semiconductor channel material.

16. The method of claim 15, wherein said forming said material stack comprises forming a another semiconductor material having a different conductivity type than said source/drain region directly beneath said source/drain region.

17. The method of claim 11, wherein said forming said top source/drain region comprises an epitaxial growth process.

18. The method of claim 11, further comprising forming a hard mask material protecting a topmost surface of said upper portion of said epitaxial semiconductor channel material structure prior to forming said top source/drain region.

19. The method of claim 15, wherein said forming said first and second functional gate structures comprises:

forming a dielectric spacer protecting said top source/drain region;

removing exposed portions of remaining portions of the top sacrificial spacer material;

removing said oxide liner;

forming a gate stack of, from bottom to top, a gate dielectric material and a first gate conductor material;

patterning said gate stack to provide gate dielectric material portions and first gate conductor material portions on each side of said bottom portion of said epitaxial semiconductor channel material structure; and forming a second gate conductor material portion each of said first gate conductor material portions.

20. The method of claim 11, wherein said forming said bottom air gap spacer and said top air gap spacer comprises:

removing said bottom and top sacrificial spacer materials to provide a bottom gap and a top gap, respectively; and sealing said bottom and top gaps by forming dielectric air gap portions at an exposed end of each of said bottom and top gaps.

* * * * *